United States Patent [19]
Barker

[11] Patent Number: 5,555,207
[45] Date of Patent: Sep. 10, 1996

[54] ELECTROMAGNETIC FIELD FREQUENCY AND IMAGE MAGNETIC FORMS QUANTUM ANALYZER APPARATUS

[76] Inventor: Stanley Barker, 1101 McKinley St., Philadelphia, Pa. 19111

[21] Appl. No.: 238,010

[22] Filed: May 3, 1994

Related U.S. Application Data

[63] Continuation-in-part of Ser. No. 106,647, Aug. 16, 1993, abandoned, which is a continuation-in-part of Ser. No. 935,548, Aug. 26, 1992, abandoned.

[51] Int. Cl.⁶ ................................................ G01R 31/00
[52] U.S. Cl. .................... 324/121 R; 324/258; 324/72
[58] Field of Search ...................... 324/96, 501, 158.1, 324/127, 126; 343/126, 844; 340/600, 691, 693; 362/103, 107; 324/95, 102, 112, 113, 96, 258, 260, 72; 342/169; 364/525; 356/327, 364

[56] References Cited

U.S. PATENT DOCUMENTS

| | | | |
|---|---|---|---|
| 3,336,594 | 8/1967 | Hotz et al. | 342/169 |
| 3,634,887 | 1/1972 | Buchholz et al. | 343/5 PC |
| 3,719,812 | 3/1973 | Bishop et al. | 343/17.7 |
| 3,745,357 | 7/1973 | Been | 250/336.1 |
| 3,750,017 | 7/1973 | Bowman et al. | 324/72 |
| 4,277,744 | 7/1981 | Audine et al. | 324/72 |
| 4,277,745 | 7/1981 | Deno | 324/72 |
| 4,442,350 | 4/1984 | Rasfleigh | 250/227.17 |
| 4,571,539 | 2/1986 | Rodriguez-Pena et al. | 324/72 |
| 4,584,523 | 4/1986 | Elabd | 324/96 |
| 4,822,169 | 4/1989 | Distl et al. | 356/364 |
| 4,905,169 | 2/1990 | Buican et al. | 356/327 |
| 5,010,342 | 4/1991 | Jones, Jr. | 342/169 |
| 5,027,819 | 7/1991 | Crum | 324/244 |
| 5,157,334 | 10/1992 | Lowther | 324/501 |

*Primary Examiner*—Vinh P. Nguyen
*Attorney, Agent, or Firm*—Zachary T. Wobensmith, III

[57] ABSTRACT

An electromagnetic field frequency and image magnetic forms quantum analyzer apparatus for collecting and evaluating magnetic field waves, which includes a sensor, a tape recorder for recording the waveforms, an oscilloscope for displaying the waveforms, film and video cameras to record the locations and wave images, a cassette recorder for recording and playback for studying the waveforms and can include a computer to display and dissect the waveforms.

3 Claims, 2 Drawing Sheets

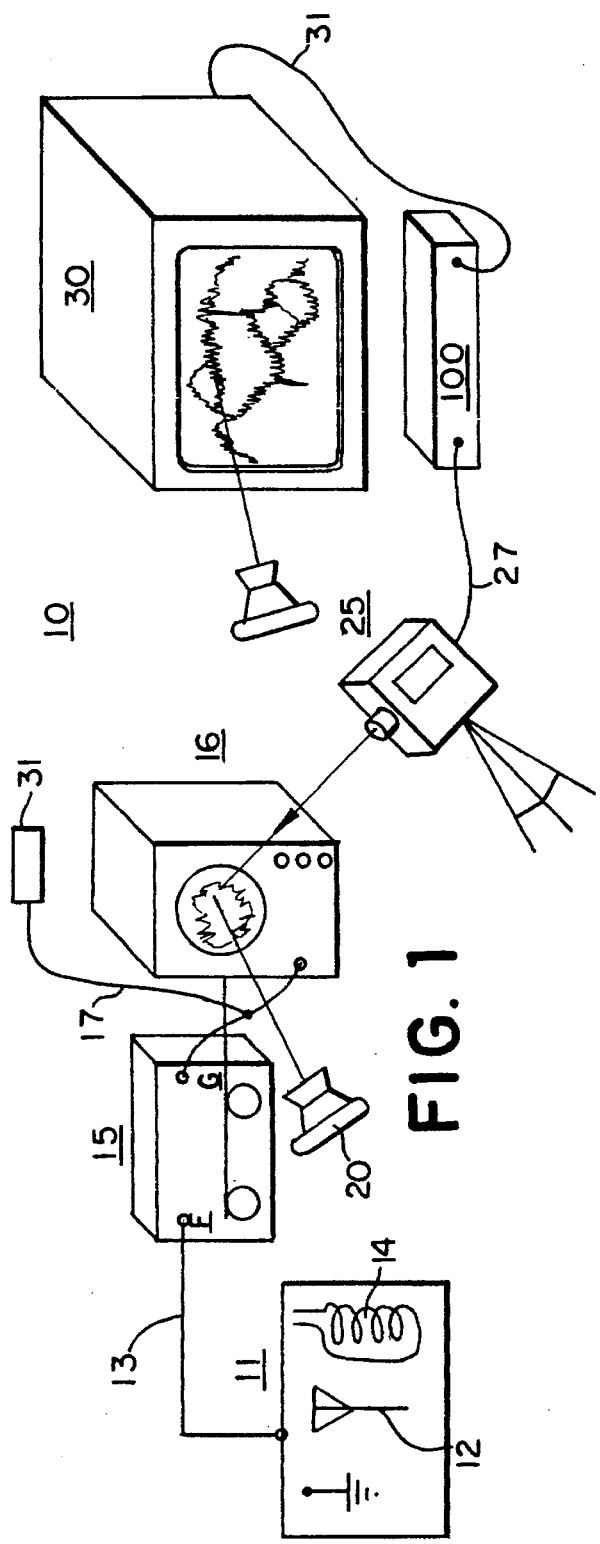
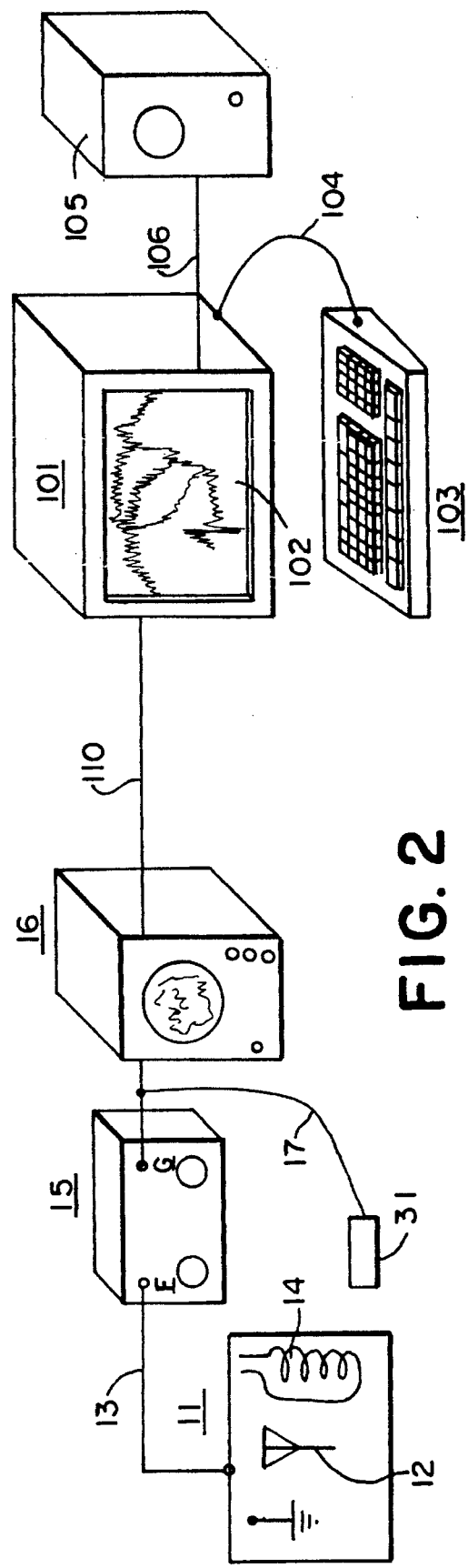

ELECTROMAGNETIC FIELD FREQUENCY AND IMAGE MAGNETIC FORMS QUANTUM ANALYZER APPARATUS

CROSS REFERENCE TO RELATED APPLICATIONS

This application is a continuation in part of my prior application Ser. No. 08/106,647 filed Aug. 16, 1993 (now abandoned), which is a continuation in part of my prior patent application Ser. No. 07/935,548 filed Aug. 26, 1992 (now abandoned).

BACKGROUND OF THE INVENTION

1. Field of the Invention

This invention relates to apparatus for collecting and evaluating electromagnetic field waves at specific locations, of the type which provides a permanent record of the observed waves, and permits their evaluation and comparison for characteristic wave forms.

2. Description of the Prior Art

From time immemorial the earth has existed in a virtual sea of electromagnetic fields. All creatures including humans, animals and all living things were and are constantly being bombarded by these energy fields, both emanating from within and without the earth.

The exact qualitative and quantitative degree and kinds of such energy present during the aeons commencing with the appearance of life can only be hypothesized, but its existence is not questioned.

We can estimate the effects of increasing or decreasing various energy fields on life forms; just as we attempt to predict the effect of increasing $CH_4$-Methane, $CO_2$ pollution or ultraviolet radiation, but clear answers have not emerged. What is known is that in our daily lives in industrial societies we are subjected to ever increasing amounts of man-made electromagnetic radiation, which did not previously exist.

For some time the scientific community and various consumer groups have questioned the beneficial/deleterious consequences of electrical current, and the effect of electromagnetic fields on human populations. Medical application of electric current to enhance bone growth in children has been proven to yield spectacular results. Ionization or de-ionization of the air in the working place is controversial as to the effects of electromagnetic waves on animals, plants and humans. The electromagnetic radiation from T.V.'s, computers and electric blankets has generated sufficient controversy so that manufacturers have made design changes which they believe will nullify the effects of these fields.

The electric power industry has acknowledged a need to redesign and relocate transmission lines, and systems to reduce electromagnetic forces present in the community.

In some towns, there appear to be higher incidents of birth defects and cancer that appear to be clustered in certain areas, but no studies have been conducted which definitely elicited the cause of the defects or cancer.

The emphasis in various past and current investigations has been in the detection of fields and their strength at various locations where people are exposed to them, but no apparatus has been proposed to collect data on the waves, and to analyze and compare waveform characteristics where there is an apparent induced higher evidence of problems within a suspected area than would normally be present according to population statistical studies.

Examples of U.S. Patents which relate to electromagnetic waves are Been U.S. Pat. No. 3,745,357; Bowman et al. U.S. Pat. No. 3,750,017; Audone et al. U.S. Pat. No. 4,277,744; Deno U.S. Pat. No. 4,277,745; Rashleigh U.S. Pat. No. 4,442,350; Rodriguez-Penna et al. U.S. Pat. No. 4,571,539; Distl et al. U.S. Pat. No. 4,822,169; Buican et al. U.S. Pat. No. 4,905,169; Blouke U.S. Pat. No. 4,951,106; and Crum U.S. Pat. No. 5,027,819. Many articles have been written relating to electromagnetic waves and their possible effect on humans such as: "Electric and Magnetic Fields; Measurements and Possible Effects on Human Health" by Alvin Leonard et al., (1990) published by California Department of Health Studies, 2151 Berkeley Way, Room 704, Berkeley, Calif. 94704, and "Power-Line Static" by Carol Ezzell, *Science News*, Vol. 140, pages 202–3, edition of Sep. 29, 1991. These patents and the various reported studies were directed to evaluating the presence and strength of observed electromagnetic fields and not to the waveform characteristics. The debate over the health effects of fields from electric power lines which is discussed in the *Science News* article Vol. 140, pages 202–3 is interesting and indicates that there may be harmful health effects from exposure to electromagnetic field waves. The statistics, however, do not yield results that can be relied upon for scientific determination as to the possible harmful effects on humans from proximity to power lines and other sources of electromagnetic fields. One of the problems with these studies, some of which appear to indicate that those exposed to high electromagnetic waves were at a higher risk of getting cancer, is that no direct measurement of the actual individual exposure to the electromagnetic fields was made. In addition, none of the researchers considered that it may not be the total electromagnetic field exposure that causes an apparent higher incidence of cancer among groups exposed to elevated electromagnetic fields, but that as yet unrecognized common waveform characteristics may be at fault, which affect the exposed groups.

Accordingly, the present invention is directed to apparatus for collection and evaluation of electromagnetic waveforms.

SUMMARY OF THE INVENTION

The apparatus for analysis of electromagnetic field waves is useful for the study of changes in the earth's normal magnetic field patterns at locations or areas of geological fault lines, earthquake epicenters, the pressing or shifting together of shelves of subterranean rock which create Piezo Electrical effects, that modulate the frequencies, and intensify the changes of the earth's magnetic field similar to the modification of a radio transmission carrier wave.

The apparatus is also useful to study changes in the earth's normal magnetic field patterns, which are affected by the presence of subterranean deposits of ore, coal or oil which can be detected by the apparatus and their presence revealed by comparison with known detected and recorded field observations.

This invention is directed to apparatus for collecting and evaluating electromagnetic field waves, which includes a sensor or transducer to pick up the waves, an oscilloscope or monitor to display the waves, a magnetic tape recorder to record the waveforms, cameras to record the waveforms on film and video, a monitor to display the recorded wave images, and may include a computer, connected by an interface to the oscilloscope to store the recorded waveforms, and which apparatus permits recording waveforms at selected locations with a video record of the locations and the waveform pattern overlying the video image. The apparatus permits isolation of waveforms, and evaluation and comparison of selected waveforms.

The principal object of the invention is to provide apparatus for collection and evaluation of electromagnetic field waves.

A further object of the invention is to provide apparatus of the character aforesaid which uses readily available components.

A further object of the invention is to provide apparatus of the character aforesaid which provides a permanent video record at selected locations with the waveforms superimposed thereon.

A further object of the invention is to provide apparatus of the character aforesaid which can be used with an infinite variety of waveforms.

Other objects and advantageous features of the invention will be apparent from the description and claims.

DESCRIPTION OF THE DRAWINGS

The nature and characteristic features of the invention will be more readily understood from the following description taken in connection with the accompanying drawings forming part hereof in which:

FIG. 1 is a pictorial view illustrating one embodiment of the apparatus of the invention;

FIG. 2 is a view similar to FIG. 1, but illustrating another embodiment of apparatus of the invention.

It should of course be understood that the description and drawings herein are merely illustrative and that various modifications and changes can be made in the structure disclosed without departing from the spirit of the invention. Like numerals refer to like parts throughout the several views.

DESCRIPTION OF THE PREFERRED EMBODIMENTS

Figure 3:
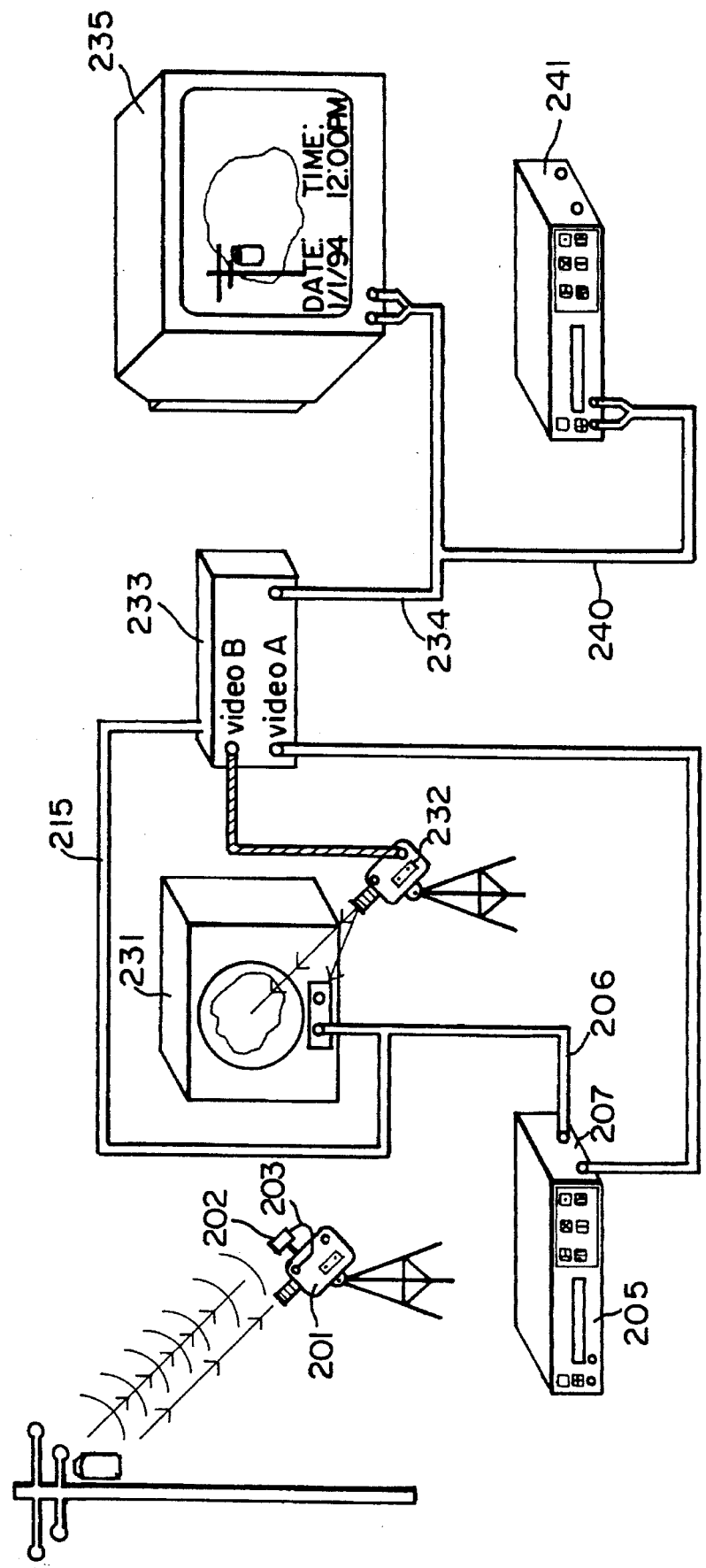
FIG. 3 is a view similar to FIG. 1, illustrating still another embodiment of the invention.

Referring now more particularly to the drawings and FIG. 1, thereof, one embodiment of apparatus 10 in accordance with the invention is therein illustrated. The apparatus 10 includes a sensor or transducer 11, which detects the presence of electromagnetic field waves. The sensor 11 as illustrated includes at least one probe 12 of well known type, which can be stuck in the ground to pick up magnetic currents, and when elevated acts as an antenna to collect electromagnetic field waves, such as those generated by electrical currents from a power line. The probe 12 is connected to a search or collector coil 14. The coil 14 is a helix wound coil which is directional in relation to its linear Z-axis. The coil is calibrated at this point by an F. W. Bell Gauss Meter Model EFF 4060 available from F. W. Bell, Orlando, Fla. The distance to the emitting location may be measured or determined by a Coleman Optic Range Finder of well known type available from Herbach-Rademan, Philadelphia, Pa. The search coil 14 is preferably mounted on a tripod (not shown) and connected by shielded leads 13 to a tape cassette recorder 15, of well known type, such as a Realistic CRT 68 available from Radio Shack Corporation.

The cassette recorder 15 receives the output from coil 14 and records it on a cassette tape (not shown) which provides a permanent record of the electromagnetic field waves at selected locations which are detected by the sensor 11.

A cable 17 is connected to recorder 15 and can be connected to a Digital Voltmeter, to calibrate the output voltage, which voltmeter is of well known type such as a Systrom-Dover Model 9000 (not shown) available from Herbach-Rademan, Philadelphia, Pa.

The cassette recorder 15 is also connected to an oscilloscope 16 by the cable 17. A frequency counter 31 of well known type such as the Model WD-754 available form Price Street, Philadelphia, Pa, with a 5 Hz to 199 MHz range, can be connected to cable 17 for frequency calibration to check the demodulation ratio of the cassette tape recorder 15 (1×10 input to a 1×2 output), so that tapes and cassettes can be calibrated by comparison of the signal input to the output of a signal from an audio oscillator and the frequency counter. This data can then be imaged with its identified frame as a permanent record.

The oscilloscope 16 is of well known type and can be an X-Y monitor, Telonic Oscilloscope Model 121, available from Herbach-Rademan, Philadelphia, Pa. The X-axis is driven by the observed or recorded electromagnetic field currents. The Y-axis is driven by Time Pulses from a Jackson Audio Oscillator Model 605D, also available from Herbach-Rademan, Philadelphia, Pa., with a range of 20 to 200K Hz (not shown) or by a Textronic Time Marker (not shown) as a calibrator for frequency identification. The oscilloscope 16 visually displays the recorded field waveforms from the cassette recorder tape (not shown), which can be enlarged and dissected as desired. The waveforms can be photographed by a camera 20, such as a Kodak Disc Model 4100 available from Eastman Kodak, Rochester, N.Y. to provide a permanent record of the wave forms or portions thereof as desired. The recorded image patterns of the electromagnetic fields, with proper calibration, can also be measured to determine the gauss strength, and the frequencies calibrated by comparison with a signal generator (not shown). The signal strength calibration of the waveforms provides the radiation strength in amperes, or combined as watts of radiation.

The wave patterns on oscilloscope 16 can also be photographed by a video camera 25 of well known type, such as an Olympus S-VHS Movie VX-5405 available from Circuit City, Bustleton/Cottman Avenues, Philadelphia, Pa.

The video camera 25 can be connected to a video cassette recorder 26 of well known type, such as a Sony Model SLV-373 U.C. Dual Shuttle Mode, available from Circuit City, Philadelphia, Pa., by a cable 27 with a cassette tape therein (not shown), or the camera 25 can record the images on the oscilloscope on an internal tape (not shown), which can then be placed in the recorder 26 and played back as desired.

The data can be strobed, dated and indexed for future reference on video tape and if required a visual to electrical interface can be used (not shown). The video tape recording can be played back by the video cassette recorder/player 26 and the tape can be indexed during recording to identify each frame for future reference. The video cassette recorder 26 is played with pausing shuttle jogging to visibly analyze the observed or pre-recorded electromagnetic fields.

The video cassette recorder 26 can also pause specific frames so that they can be analyzed. The video cassette recorder 26 is connected by a cable 33 to a monitor 30 of well known type such as a Sylvania 25-inch Model #S 101-0888 available from Circuit City, Philadelphia, Pa. which provides for detailed visual analysis of the electromagnetic field waves. A camera 35 can also be provided of well known type such as a Kodak Disk Model 4100, to photograph the image patterns on monitor 30 to provide a permanent record. The photographs can be enlarged to study and compare field waveforms from different locations, to ascertain if there appear to be characteristic patterns, which are present in areas that have a high incidence of cancer or another anomaly which is otherwise unexplained.

As described above, it is also expected that the wave patterns will be useful in other applications such as determining magnetic field patterns which indicate various underground anomalies, i.e. oil, gas and mineral deposits.

Referring now more particularly to FIG. 2 another embodiment of apparatus 100 is illustrated. The apparatus 100 includes a sensor or transducer 11, which detects the presence of electromagnetic field waves, with probe 12 and coil 14 as described for apparatus 10. The transducer 11 is connected to a tape cassette recorder 15, and can be connected by cable 17 to an oscilloscope 16 as described for FIG. 1.

A digital voltmeter (not shown) or a frequency counter 31 can be connected to the recorder 15 as described for apparatus 10. The oscilloscope 16 is connected by cable 110 to a computer 101 such as a 386sx Global IBM PC-compatible available from Global Computer Supplies, II Harbor Park Drive, Port Washington, N.Y. 11050, which includes a monitor 102 and a keyboard 103 connected to a hard drive 105 by cable 106. The hard drive 105 is of well known type and can be a part of the computer 110 if desired. The computer 101 displays the images as they are transmitted from the recorder 15, or the hard drive 105, and can be manipulated to isolate various portions of the waveforms to determine common characteristics which upon analysis can be isolated and studied as described for apparatus 10.

Referring now more particularly to FIG. 3 the apparatus 200 is therein illustrated. A video camera 201 is provided of any well known type and preferably the same as camera 25. The video camera 201 is preferably equipped with a distance range finder, and with automatic focus of the camera lens. The camera 201 can be of the single video tape or the double video tape type.

The camera 201 has a helix Z-axis E.M.F. coil 202 attached thereto which can be mounted on top or on the front of the camera, with its Z-axis aligned with the optical Z-axis of the camera 201. The coil 202 is of conventional type and can be connected to the camera audio input circuitry by cable 203 whereby its output signal is recorded on a video tape (not shown) in camera 201 for the single video tape version.

In the dual tape version (not shown) the signal from the coil can be recorded on the second video tape (not shown).

The video tape (not shown) (in the single tape version) after the video signal from the location has been recorded thereon provides a picture of the location where the E.M.F. forces are to be recorded. A concurrent series of E.M.F. data is recorded on the audio portion of the tape (not shown) which can be played in a video cassette player 205, which can be the same as recorder 26. The player 205 has a cable 206 attached to its output terminal 207 and to the input of a frequency counter 231 similar to counter 31. The E.M.F. images which appear on counter 231 can be recorded by a video camera 232, which is connected to a video mixer 233 of well known type, which is connected by cable 234 to a T.V. monitor 235. The player 205 has a cable 236 connected to its video output terminal and to the cable 234 of the video mixer 233, which superimposes the video image of the location on the E.M.F. waveform, and produces a video image of the location on the monitor 235 with an overlaid waveform pattern. The T.V. monitor 235 can be connected by cable 240 to a video cassette recorder 241 which with a video tape (not shown) can record and play back the superimposed or overlaid images of specific locations and the detected E.M.F. waveforms at the locations.

If the double video tape camera (not shown) is used, the two images, i.e. that of location and of E.M.F. waveforms can be combined in the video mixer 233, thereby simplifying the apparatus required.

It will thus be seen that apparatus has been described with which the objects of the invention are attained.

I claim:

1. An electromagnetic field frequency and image magnetic forms quantum analyzer apparatus which collects and evaluates electromagnetic field waves and visual images of selected locations which comprises:

video camera means to record visual images and non-visible electromagnetic field wave recordings, which includes magnetic tape means therein to receive and record visual images thereon at said selected locations, electromagnetic field wave sensor means on said camera means aligned with said visual image recording, to receive and record the non-visible electromagnetic field waves on said magnetic tape means simultaneously with said visual images of said selected locations, and means for converting said recorded electromagnetic field waves to visible wave form images and for mixing the wave form images and visual images of selected locations to provide a permanent record.

2. Apparatus as defined in claim 1 in which said magnetic tape means is a single video tape with a video track and an audio track, said video images are recorded on said video track, and said electromagnetic field waves from said sensor means are recorded on said audio track.

3. Apparatus as defined in claim 2 in which said converting means includes a video cassette recorder/player to receive said video tape, and a video mixer is provided which receives the electromagnetic field wave form image from said converting means and is also connected to said cassette recorder/player to receive visual images which are superimposed on said visual image therefrom of said selected locations.

\* \* \* \* \*